United States Patent [19]

Gittinger

[11] 3,983,489

[45] Sept. 28, 1976

[54] DOUBLING MIXER

[75] Inventor: Norman C. Gittinger, Schenectady, N.Y.

[73] Assignee: General Electric Company, Schenectady, N.Y.

[22] Filed: June 16, 1975

[21] Appl. No.: 586,876

[52] U.S. Cl. .................................. 325/449; 325/446

[51] Int. Cl.[2] ............................................ H04B 1/26

[58] Field of Search ........... 325/431, 434, 435, 446, 325/442, 449, 451, 430; 307/88.3; 328/15, 19, 20; 329/163, 164; 321/65, 68, 69 R, 69 NL

[56] References Cited

UNITED STATES PATENTS

| | | | |
|---|---|---|---|
| 2,088,432 | 7/1937 | Peterson | 325/430 |
| 2,608,650 | 8/1952 | Myers | 325/430 |
| 2,616,033 | 10/1952 | Adler | 325/442 |
| 3,227,955 | 1/1966 | Yasuda et al. | 325/435 |
| 3,665,508 | 5/1972 | Gawler | 325/446 |

*Primary Examiner*—Robert L. Griffin
*Assistant Examiner*—Jin F. Ng
*Attorney, Agent, or Firm*—Stephen B. Salai; Joseph T. Cohen; Jerome C. Squillaro

[57] ABSTRACT

A doubling mixer includes an input tuned circuit adjusted to the frequency of an input signal, an output tuned circuit tuned to the desired output frequency, and a local oscillator. Semiconductor switch means are interposed between said input and output tuned circuits, the switch means being responsive to the local oscillator to conduct twice during each cycle thereof. The relationship between the input and output signal frequencies as a function of the local oscillator frequency may be expressed as:

$$F_{IF} = F_S \pm 2\, F_{LO}$$

2 Claims, 6 Drawing Figures

Fig. 3
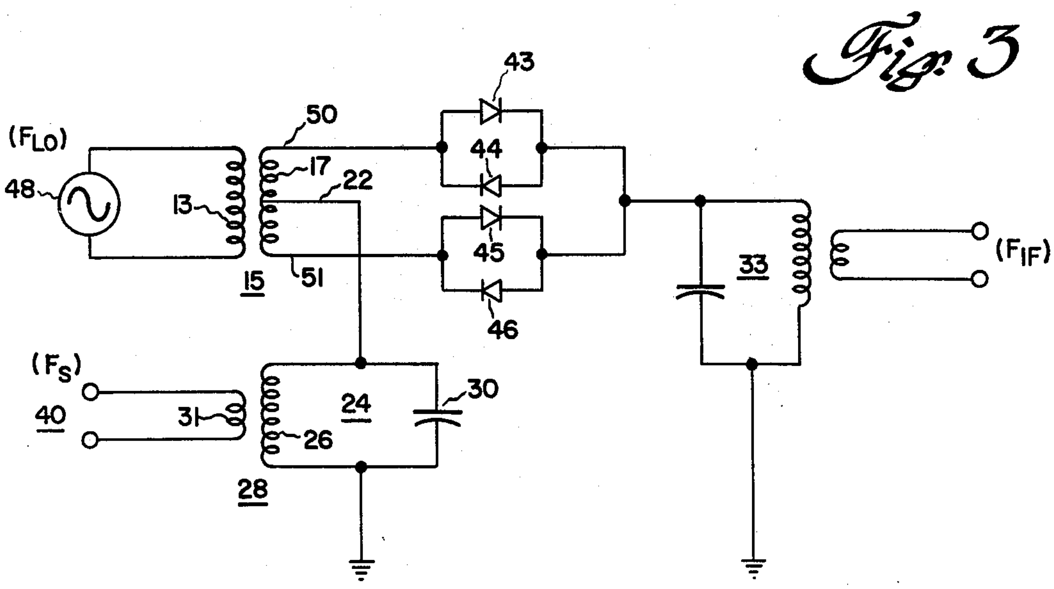
Fig. 5
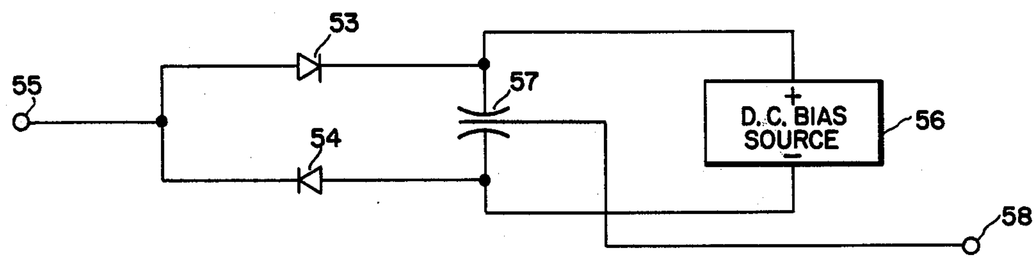
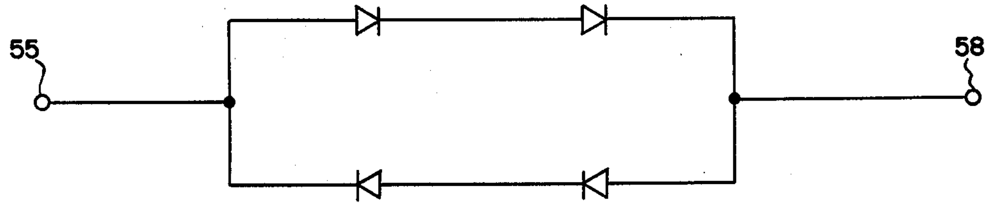
Fig. 6

DOUBLING MIXER

This invention relates, in general, to radio frequency mixers and, more specifically to diode mixers employing local oscillators having a frequency one-half the frequency required for prior art mixers.

The use of mixers for frequency conversion of electrical signals is well known in the prior art. Conventionally, an input signal at a first frequency and a local oscillator signal at a second frequency are applied to a mixer to produce an output signal at a frequency equal to the sum and/or difference of the input frequency and local oscillator frequency. Tuned circuits are utilized to discriminate between the desired and undesired output frequencies.

Mixers themselves along with their associated local oscillators may take various forms. For example, vacuum tubes have long been utilized in radio frequency transmitters and receivers to provide frequency changing functions. Discrete mixers and local oscillators along with converters which combine the functions of the mixers and local oscillators are well known. More recently, transistors have been utilized in mixing operations. The type of mixers hereinabove referred to are generally known as heterodyne mixers. Another form of mixer which is becoming increasingly popular, especially at very high radio frequencies is the diode mixer. Depending upon whether the mixer is of the unbalanced, single balanced or double balanced type, the mixer will include one or more semiconductor diodes. Conventionally, these diodes are connected with a local oscillator signal source of sufficient amplitude to render the diodes conductive once during each cycle of the local oscillator signal. During this conductive portion of the cycle an input signal is conducted by the diodes to an output port. The switching action of the diode or diodes provides an output frequency which is equal to the sum and difference of the local oscillator frequency and the input signal frequency.

While the diode mixer of the type hereinabove described is widely utilized in appropriate circumstances, it suffers from certain disadvantages. For example, where very high frequencies are involved, the generation of suitably stable local oscillator signals at the required frequencies may be difficult or expensive. This requirement is particularly important in television receiver circuits in which cost may be a very substantial factor in circuit design. For example, mixers for conversion of UHF television signals to lower frequencies where they may be processed during reception conventionally requires the use of a local oscillator operating at or near the range of the received UHF signals. Typically, a local oscillator operating in the 517–931 MHz range is required. Further, a preselector is conventionally utilized in the receiver signal path before the mixer to reject the local oscillator frequency in order to prevent radiation from emanating from the receiver. The selectivity of the tuned circuits in this preselector must be sufficient to insure their rejection of the local oscillator signal while passing substantially unimpeded the desired television signals. Further, the local oscillator itself must have sufficient stability to allow the reception of UHF television signals without frequent readjustment being required.

Recently, the use of varactors in television receivers to allow electronic rather than mechanical tuning systems to be utilized has become common. As is well known, the Q or quality factor of a varactor is inversely proportonal to the frequency at which it is operating. It may be appreciated, therefore, that reducing the required local oscillator frequency will provide substantial advantages.

Accordingly, it is an object of this invention to provide a mixer circuit which requires a local oscillator injection frequency one-half that required by prior art mixers.

It is another object of this invention to provide a mixer of comparable complexity and cost to prior art mixers.

Briefly stated and in accordance with one aspect of this invention, a doubling mixer is provided wherein an input signal is combined with a local oscillator signal to produce an output signal at a frequency equal to the sum or difference of the frequencies of the input signal and twice the local oscillator signal. First and second tuned circuits adjusted respectively to the frequencies of the input and output signals are connected by switch means responsive to a local oscillator signal for alternately connecting and disconnecting the first and second tuned circuits twice during each full cycle of the local oscillator signal.

The features of the invention which are believed to be novel are pointed out with particularity in the appended claims.

The invention itself, however, both as to its organization and method of operation together with further objects and advantages thereof may best be understood by reference to the following description taken in connection with the accompanying drawings in which:

FIG. 3 is a schematic diagram of a doubling single balanced mixer in accordance with this invention.

FIG. 5 is a partial schematic diagram of a method in accordance with this invention for providing higher signal handling capability.

FIG. 6 is an alternative method in accordance with this invention for providing higher signal handling capacity.

Figure 1:
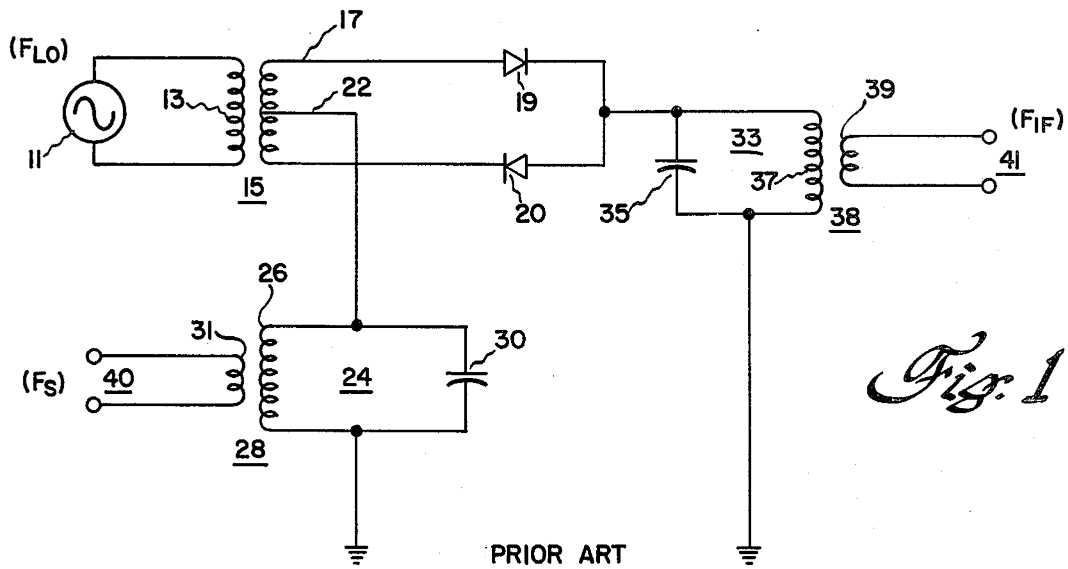
FIG. 1 is a schematic diagram of a single balanced mixer in accordance with the prior art.

Referring to FIG 1, there is shown in schematic diagram form a normal single balanced mixer in accordance with the prior art. A local oscillator 11 is connected to input winding 13 of transformer 15. The center tapped secondary winding 17 is connected to diodes 19 and 20. The center tap 22 of secondary winding 17 is connected to parallel resonant circuit 24 which includes the secondary 26 of transformer 28 and capacitor 30. Primary 31 of transformer 28 is adapted to be connected to the input of the mixer. Diodes 19 and 20 are connected to parallel resonant circuit 33 which includes capacitor 35 and primary winding 37 of transformer 38. Secondary winding 39 of transformer 38 is the output winding of the mixer. Parallel resonant circuits 24 and 33 are conventionally grounded as shown. In operation, parallel resonant circuit 24 is tuned to the frequency of the signal applied to mixer input 40. Similarly, resonant circuit 33 is tuned to the desired output frequency of the mixer. Local oscillator 11 provides a voltage through transformer 15 through diodes 19 and 20 which turns each diode on once during each cycle. It is to be noted that insofar as diodes 19 and 20 are pulled in opposite directions, that both diodes are turned on simultaneously. It can be seen, therefore, that during half of each cycle of local oscillator 11 both diodes 19 and 20 are turned on for that portion of the cycle when the voltage across the diodes exceeds the turn-on voltage thereof. During the other half cycle both diodes are reverse biased and therefore non-conducting. During the time when diodes 19 and 20 are conducting, the signal appearing at center tap 22 of transformer 15 is conducted to resonant circuit 33 and appears at output 41 of the mixer. It will be appreciated that the mixer of FIG. 1 produces an output frequency spectrum which includes a plurality of components. The major components are at frequencies equal to the sum and difference of the local oscillator frequency and the input signal frequency. It is an advantage of a balanced mixer of the type shown in FIG. 1 that the local oscillator frequency is substantially canceled at the output.

Figure 2:
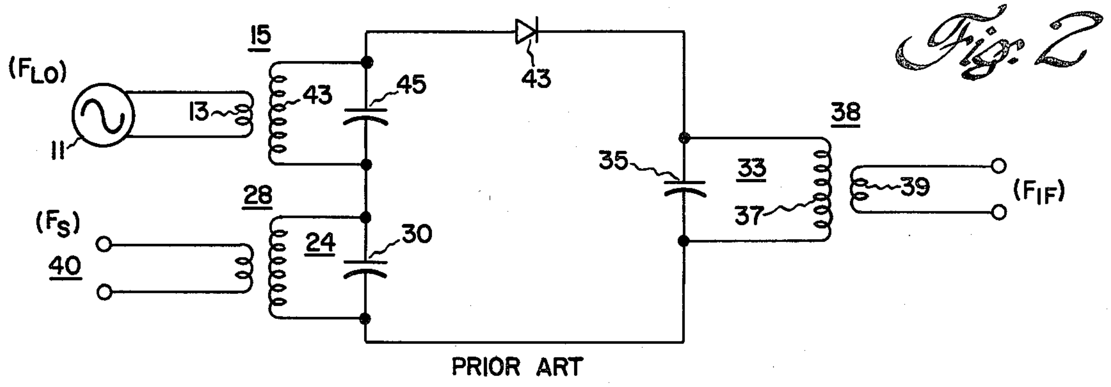
FIG. 2 is a schematic diagram of an unbalanced mixer in accordance with the prior art.

FIG. 2 shows in schematic form an unbalanced mixer in accordance with the prior art. It will be noted that the mixer of FIG. 2 resembles in many ways the mixer hereinabove discussed in connection with FIG. 1. A local oscillator 11 is connected to an input winding 13 of transformer 15, the secondary winding 43 thereof being part of a parallel resonant circuit including capacitor 45. Input 40 is connected through transformer 28 to parallel resonant circuit 24 which is tuned by capacitor 30 to the frequency of the input signal. The local oscillator resonant circuit and the input signal circuit are connected in series with diode 43 and the output resonant circuit 33. Output resonant circuit 33 includes a capacitor 35 and the primary 37 of output transformer 38 which includes secondary winding 39. In operation a relatively large local oscillator signal is effective to turn on diode 43 once during each cycle thereof allowing the input signal present at input 40 to be applied to output resonant circuit 33. The switching action of diode 43 provides the desired mixing function. It will be appreciated that local oscillator 11 must provide a signal of sufficient amplitude to turn on diode 43 once during each cycle. It will further be appreciated that the amplitude of the signal applied to input 40 should be sufficiently small that diode 43 not be turned on by that signal alone. The required local oscillator frequency to produce an output signal at a desired frequency where the frequency of the input signal is known may be readily expressed as:

$$F_{LO} = F_S \pm F_{IF}$$

where $F_{LO}$ is the frequency of the local oscillator signal, $F_S$ is the frequency of the input signal to the mixer and $F_{IF}$ is the frequency of the mixer output. The output spectrum of the mixer of FIG. 2 includes, inter alia, the local oscillator frequency, the input signal frequency, and the sum and difference of these frequencies. The amplitudes of these components depend upon the bandwidth of the tuned circuit 33.

A doubling single balanced mixer in accordance with the schematic diagram shown at FIG. 3 provides a mixer wherein the local oscillator frequency required is one-half that required in accordance with the prior art mixers hereinbefore known, as for example, the mixer shown in FIG. 1. It will be appreciated that the mixer of FIG. 3 is substantially identical to that of FIG. 1 save only that each of diodes 19 and 20 of FIG. 1 is replaced by two back-to-back diodes 43, 44 and 45, 46. Local oscillator 48 shown connected to primary winding 13 of transformer 15 which also includes center tapped center winding 17 is substantially identical in function to local oscillator 11 of FIG. 1 except that the output frequency of local oscillator 48 of FIG. 3 is one-half that required for local oscillator 11 of FIG. 1 to provide the same output frequency for a given input frequency. Mixer input 40 shown connected to primary winding 31 of transformer 28 the secondary 26 of which combines with capacitor 30 to form parallel resonant circuit 24 is substantially identical to that shown in FIG. 1. It will be appreciated that while a particular form of input coupling network is shown that a variety of such networks as would be well known to one skilled in the art would be appropriately used in particular circumstances. For example, as is well known, transformer 28 may conveniently be replaced where desired by a single tapped coil to provide the desired input impedance transformation. Further, it may be preferable to provide an input network having different bandpass characteristics as, for example, would be provided by a double tuned circuit or the equivalent. Similar considerations apply to the particular selection of parallel resonant output circuit 33.

The operation of the doubling single balanced mixer in accordance with this invention may be most easily appreciated by comparing FIG. 1 with FIG. 3. It will be appreciated that while in operation diodes 19 and 20 of FIG. 1 are conducting or are "turned on" during somewhat less than one-half of each cycle of local oscillator 11. The diodes 43-46 of FIG. 3 provide two conduction periods, per cycle each somewhat less than one-half of each cycle of local oscillator 48. For example, assume that local oscillator 48 produces a substantially sinusoidal waveform and that at a given time a voltage exists between center tap 22 and transformer terminal 50 which is of positive polarity, and therefore that a similar negative polarity voltage exists between center tap 22 and transformer terminal 51. It is clear that under these conditions when a voltage exceeds the turn-on voltage of diodes 43 and 46 that these two diodes will conduct and will continue to conduct so long as the voltage is maintained above their turn-on voltage. When the output of local oscillator 48 reverses in sign during the second half of the sinusoidal waveform diodes 45 and 44 will first turn off and then conduct during that portion of the waveform when the voltage exceeds their turn-on voltage. It will be appreciated therefore that diodes 43–46 provide two periods of conduction during each cycle of local oscillator 48 while diodes 19 and 20 of FIG. 1 provide only one such period. The relationship between the local oscillator frequency, input signal frequency and output frequency of the mixer may be readily expressed as $2F_{LO} = F_S \pm F_{IF}$ where $F_{LO}$ is the local oscillator frequency, $F_S$ is the input signal frequency and $F_{IF}$ is the output signal frequency.

Figure 4:
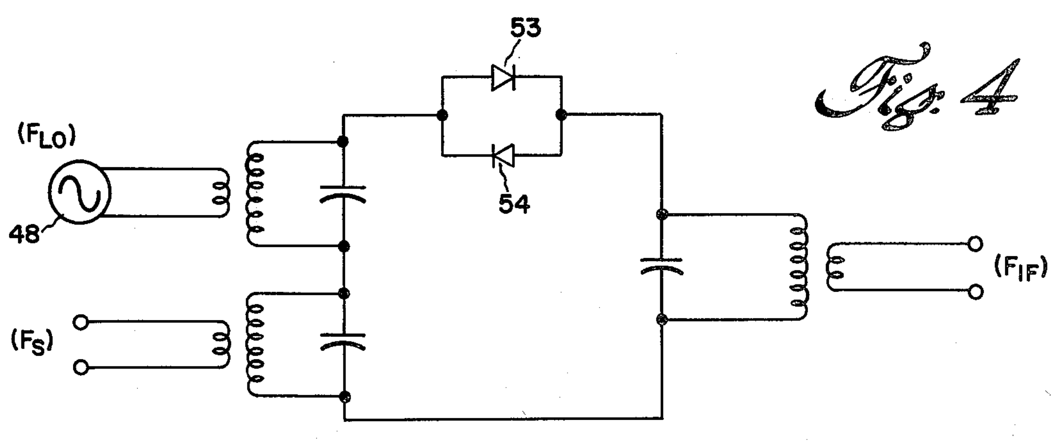
FIG. 4 is a schematic diagram of a doubling unbalanced mixer in accordance with this invention.

The doubling unbalanced mixer corresponding to the unbalanced mixer of FIG. 2 is illustrated in accordance with one embodiment of this invention in the schematic diagram of FIG. 4. It will be noted that the mixer of FIG. 4 corresponds in many respects to the prior art mixer of FIG. 2 except that diode 43 of FIG. 2 is replaced by back-to-back diodes 53 and 54. As was hereinabove described in conjunction with the operation of the mixer of FIG. 3, diodes 53 and 54 provide two periods of conduction during each cycle of the waveform produced by local oscillator 48. The frequency of local oscillator 48 may therefore be chosen as was the case with the embodiment of this invention shown in FIG. 3, to be equal to one-half that which would be required to produce the same relationship between input and out signal frequencies as provided by the mixer illustrated at FIG. 2. The relationship between local oscillator, input and output signal frequencies may be described as $2F_{LO} = F_S \pm F_{IF}$.

While the embodiments of this invention as illustrated at FIGS. 3 and 4 hereinabove described include semiconductor diodes as elements thereof, it is emphasized that this invention is not limited and may, in fact, include any of the devices known to those skilled in the art for providing the required switching action. Specifically, it is required that the input signal which is present at a first resonant circuit tuned to the frequency thereof be connected to a second resonant circuit tuned to the frequency of the desired output signal by switch means operative to be controlled by a local oscillator so as to provide two conduction periods during each cycle of the local oscillator output. While it is appreciated that semiconductor diodes provide a low cost and satisfactory method for obtaining this switching function, and that they would be preferred in many applications as, for example, when low cost is a primary consideration, other devices may equally well be employed. For example, transistors, of the bipolar or field effect type depending upon the particular application may well be desirable in certain instances. Further, many types of diodes may suitably be utilized depending upon the particular frequencies involved, as for example, hot carrier diodes or any of a number of well known switching diodes as will be understood by those skilled in the art.

It is to be understood that in contrast to the type of prior art mixer which relies upon the nonlinearities inherent in the operation of switching diodes to provide a high level of harmonic generation with respect to a local oscillator, this invention does not require nor does it desirably include high levels of harmonic energy created either by the local oscillator or the diodes. The effect of the local oscillator output waveform in switching the diodes occurs at the fundamental frequency of the oscillator rather than at any harmonic thereof and the frequency doubling which occurs is due to the presence of two diodes which conduct on alternate half cycles.

It is important in accordance with this invention as illustrated in the embodiments of FIGS. 3 and 4 to provide proper signal levels at the local oscillator and input signal inputs to the mixer. For example, the local oscillator must provide sufficient voltage to turn on the switching diodes during each half cycle of a local oscillator signal. The exact voltage required will depend, of course, upon the type of diode selected. As is well known germanium diodes require a minimum voltage to provide conduction of approximately 0.2 volts while silicon diodes generally require a minimum voltage of perhaps 0.6 volts before conduction will occur. The signal level created by the input signal across the diodes when they are in the nonconducting condition must be small enough to insure that the diodes are not rendered conducting by the input signal alone. It is clear, therefore, that the input signal level at the input to the mixer must be sufficiently low that the voltage across the diodes does not exceed 0.2 volts or 0.6 volts depending upon the particular diodes or other form of semiconductor switches utilized.

FIG. 5 shows in partial schematic diagram form a method in accordance with this invention for increasing the signal handling capability of a doubling balanced mixer. The circuit of FIG. 5 substitutes directly for a pair of oppositely poled semiconductor diodes as shown, for example, in FIGS. 3 and 4. Diodes 53 and 54 are connected together in a first terminal 55 and to a d.c. bias source 56 and a dual d.c. blocking capacitor 57, the center plate of which forms output terminal 58. D.C. bias source 56 reverse biases diodes 53 and 54 thereby requiring more local oscillator signal amplitude to turn each of the diodes on and allowing therefore a larger signal input before spurious turn-on would occur.

FIG. 6 shows an alternative circuit for increasing the signal handling capability of a mixer in accordance with this invention. In accordance with FIG. 6, two or more diodes connected in series replace each of the single back-to-back connected diodes as shown in FIGS. 3 and 4. Each additional diode increases the minimum turn-on voltage by either 4/10 or 6/10 of a volt depending upon the type of diode selected and therefore allows a commensurate increase in input signal level.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A balanced doubling mixer comprising:

radio frequency transformer means including a primary winding adapted to be connected to a source of local oscillator signals at a first radio frequency and a center tapped secondary winding having a first and second end;

first tuned circuit means connected to said center tap, said tuned circuit means including an input port adapted to be connected to a source of radio frequency signals at a second radio frequency;

first diode means including at least two semiconductor diodes connected in back-to-back circuit relationship, a first end of said diode means connected to said first end of said secondary winding, second diode means including at least two semiconductor diodes connected in back-to-back circuit relationship, a first end of said diode means connected to said second end of said secondary winding;

second tuned circuit means tuned to the output frequency of said mixer connected to the second ends of each of said first and second diode means, said second tuned circuit means including an output port, said output port producing an output signal at a frequency equal to the sum or difference of said second radio frequency and twice said first radio frequency.

2. The mixer of claim 1 wherein said first tuned circuit means and said local oscillator signal are adjustable in frequency, and track each other to provide a mixer tunable over a band of input frequencies while producing a fixed output signal frequency.

* * * * *